(12) United States Patent
DiStefano

(10) Patent No.: US 7,393,214 B2
(45) Date of Patent: Jul. 1, 2008

(54) HIGH PERFORMANCE ELECTRICAL CONNECTOR

(75) Inventor: Thomas H. DiStefano, Monte Sereno, CA (US)

(73) Assignee: Centipede Systems, Inc., San Jose, CA (US)

( * ) Notice: Subject to any disclaimer, the term of this patent is extended or adjusted under 35 U.S.C. 154(b) by 0 days.

(21) Appl. No.: 11/670,340

(22) Filed: Feb. 1, 2007

(65) Prior Publication Data

US 2007/0197099 A1    Aug. 23, 2007

Related U.S. Application Data

(60) Provisional application No. 60/774,725, filed on Feb. 17, 2006.

(51) Int. Cl.
*H01R 9/09* (2006.01)

(52) U.S. Cl. ............................. 439/66; 439/74

(58) Field of Classification Search ............... 439/66, 439/65, 74, 81, 71, 841
See application file for complete search history.

(56) References Cited

U.S. PATENT DOCUMENTS

| | | | |
|---|---|---|---|
| 3,676,838 A | 7/1972 | Hartz et al. | |
| 5,439,393 A * | 8/1995 | Watson | 439/578 |
| 5,518,410 A | 5/1996 | Masami | |
| 5,669,774 A | 9/1997 | Grabbe | |
| 5,887,344 A | 3/1999 | Sinclair | |
| RE36,442 E | 12/1999 | Kardos | |
| 6,193,524 B1 * | 2/2001 | Chang | 439/66 |
| 6,264,476 B1 | 7/2001 | Li et al. | |
| 6,720,511 B2 * | 4/2004 | Windebank | 200/275 |
| 6,722,893 B2 * | 4/2004 | Li et al. | 439/66 |
| 6,846,184 B2 | 1/2005 | Fan et al. | |
| 6,974,332 B2 * | 12/2005 | Ma | 439/66 |
| 7,014,473 B2 * | 3/2006 | Millard et al. | 439/66 |
| 7,029,288 B2 * | 4/2006 | Li | 439/66 |

* cited by examiner

*Primary Examiner*—Hien Vu
(74) *Attorney, Agent, or Firm*—Townsend and Townsend and Crew LLP; Kenneth R. Allen

(57) ABSTRACT

A socket connector for connecting a post or ball wherein the female element grips the post with resilient prongs with end tips at low insertion force but positive contact is maintained and wherein attempted withdrawal is normally inhibited by increasing force applied to the post by the female element in response to the withdrawal force. The female element comprises a tube of resilient conductive material that has been sliced or helically partitioned into opposing helical prongs so as to allow the prongs of the connector to spirally open around the post or ball-like bump and mechanically grip the post or bump as the post or bump is inserted along the longitudinal axis of the tube. The tubular element may be made by forming helical prongs in the end of a tube in helical cuts from about a mid section to one end of the tube.

14 Claims, 8 Drawing Sheets

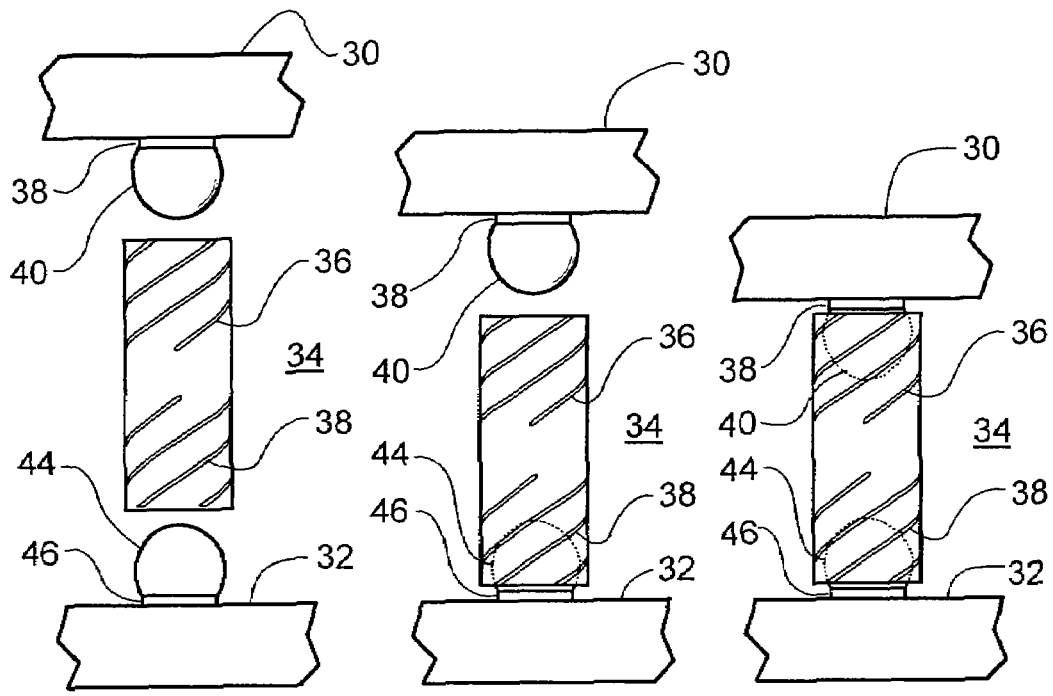
*FIG. 3A*  *FIG. 3B*  *FIG. 3C*
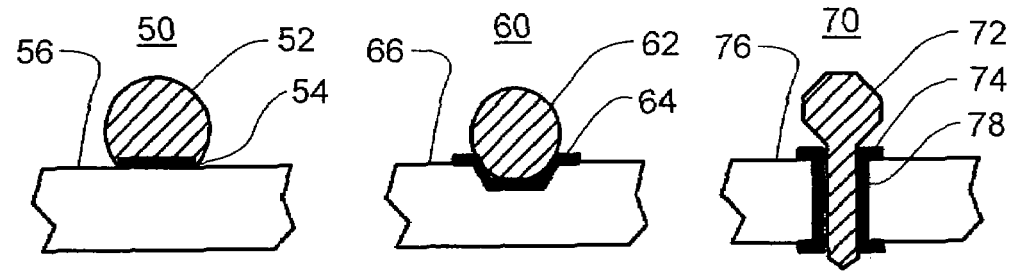
*FIG. 4A*  *FIG. 4B*  *FIG. 4C*
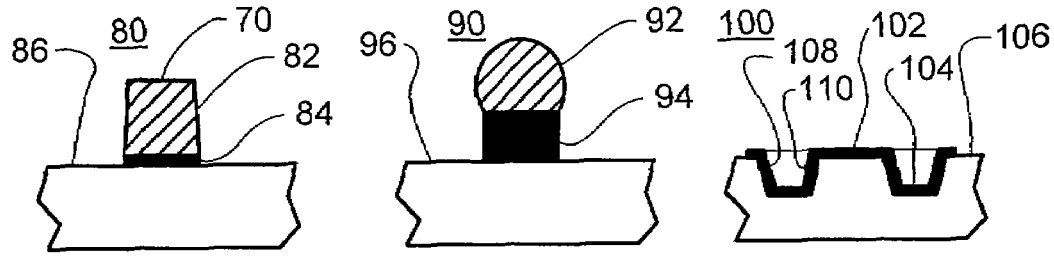
*FIG. 4D*  *FIG. 4E*  *FIG. 4F*

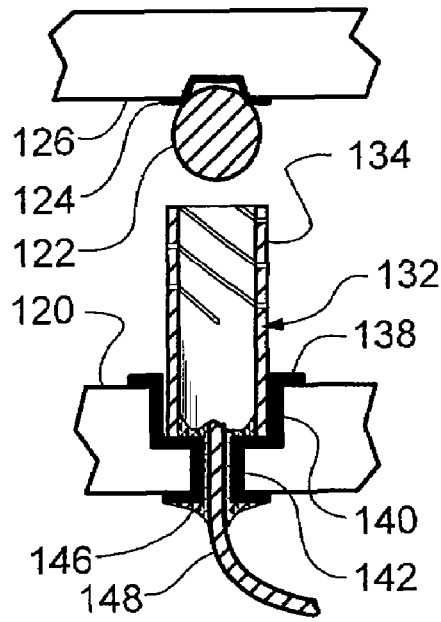
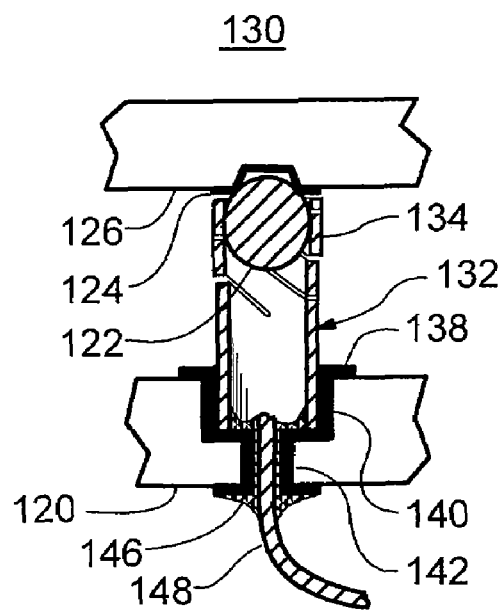
FIG. 5A
FIG. 5B
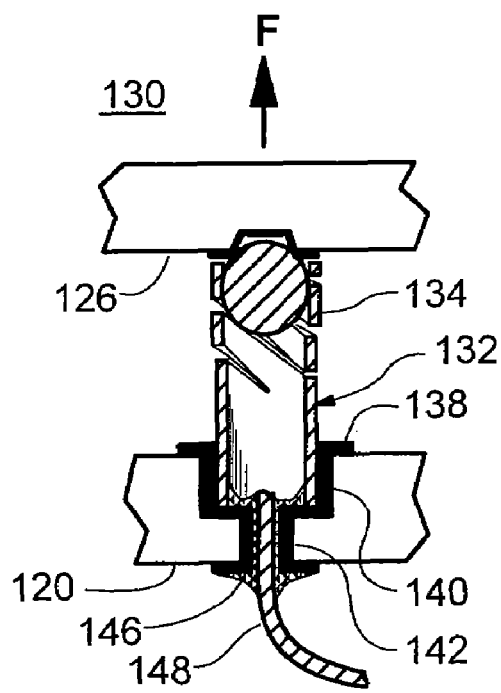
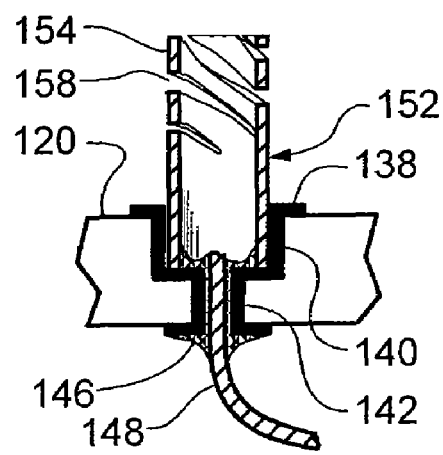
FIG. 5C
FIG. 5D

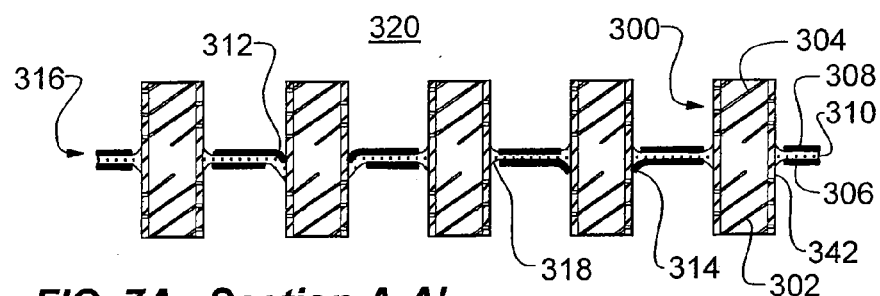
FIG. 7A Section A-A'
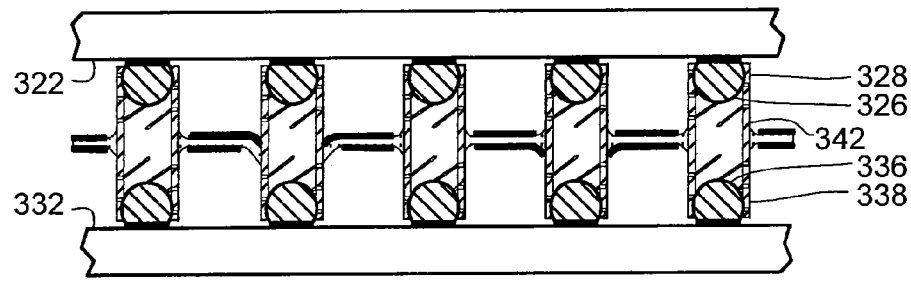
FIG. 7B
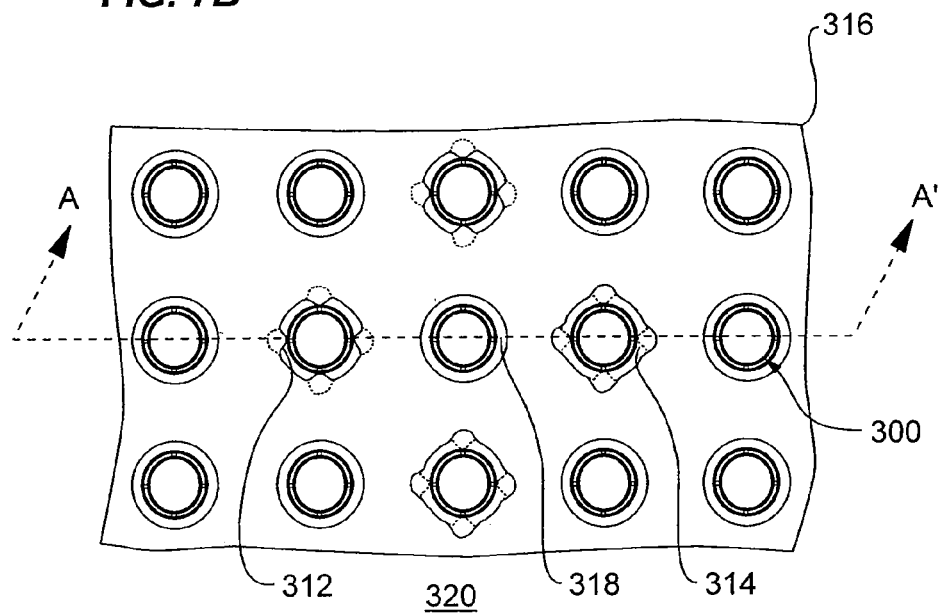
FIG. 7C

HIGH PERFORMANCE ELECTRICAL CONNECTOR

CROSS-REFERENCES TO RELATED APPLICATIONS

This application claims the benefit of U.S. Provisional Application Ser. No. 60/774,725 filed Feb. 17, 2006, on behalf of Decision Track LLC, a Subchapter S corporation sharing common ownership with the present assignee. The content of said Provisional Application is incorporated herein by reference in its entirety.

STATEMENT AS TO RIGHTS TO INVENTIONS MADE UNDER FEDERALLY SPONSORED RESEARCH AND DEVELOPMENT

Not applicable

REFERENCE TO A "SEQUENCE LISTING," A TABLE, OR A COMPUTER PROGRAM LISTING APPENDIX SUBMITTED ON A COMPACT DISK

Not applicable

BACKGROUND OF THE INVENTION

This invention relates to miniature electrical connectors, as for example ball grid array (BGA) connectors, including connectors having pin dimensions of less than 1 millimeter in diameter and pin pitches of less than two millimeters. One or more embodiments of the present invention relate to a high performance electrical connector, that is a connector for supplying high current (relative to connectors of comparable size) and high frequency (RF) signals to high performance microelectronic devices, for example, and without limitation, integrated circuits ("ICs"), including microprocessors, chips for peripheral functions and RAM memories.

Connectors are used widely in electronics to interconnect microelectronic devices such as semiconductor integrated circuits ("ICs"), printed wiring boards, system boards, backplanes and cable of various sorts. A socket is a type of connector used to connect terminals on an electronic device to corresponding contacts on a printed circuit board or other electrical interconnection means. It is often an array of female-type elements intended to engage male-type elements of a plug array. In addition, sockets are routinely used in systems for: (a) testing electronic device performance (an assortment of socket types have been developed to connect to a device under test ("DUT") having a wide variety of terminals and configurations), or (b) burn-in of electronic devices at elevated temperatures. A cable connector is another type of connector that is typically used to connect an array of terminals on an electrical cable to a group of parallel electrical wired or other conductors. Backplane connectors and inter-board connectors are further types connectors used to connect an array of terminals on one printed wiring board to a corresponding array of terminals on another printed wiring board.

Prior art connectors are differentiated typically according to contactor type and intended end use (i.e., application). As such, connectors used in application in sockets are typically designed to make electrical contact to microelectronic devices having specific types of device terminals—types of device terminals contacted by sockets include pin grid arrays ("PGAs"), J-leads, gull-wing leads, dual in-line ("DIP") leads, ball grid arrays ("BGAs"), column grid arrays ("CGAs"), flat metal pads ("LAN" grid arrays or "LGAs"), and many others. In order to provide sockets for microelectronic devices with this variety of terminals, many contactor technologies have been developed for sockets. In addition to the foregoing, further differentiation among prior art sockets refers to low insertion force ("LIF") sockets, zero insertion force ("ZIF") sockets, auto-load sockets, burn-in sockets, high performance test sockets, and production sockets (i.e., sockets for use in products). In further addition to the foregoing, low cost prior art sockets for burn-in and product applications typically incorporate contactors of stamped and formed springs to contact terminals on a DUT. In still further addition to the foregoing, for high pin-count prior art sockets, a cam is often used to urge device terminals laterally against corresponding contactors to make good contact to each spring while allowing a low or zero insertion force.

For specialized applications, prior art sockets have used a wide variety of contactors, including anisotropic conductive sheets, flat springs, lithographically formed springs, fuzz buttons (available from Cinch, Inc. of Lombard, Ill.), spring wires, barrel connectors, and spring forks, among others. Prior art sockets intended for applications where many test mating cycles (also referred to as socket mount-demount cycles) are required typically use spring pin contactors of the type exemplified by Pogo® spring contacts (available from Everett Charles Technologies of Pomona, Calif.). Spring probes for applications in the electronics test industry are available in many configurations, including simple pins and coaxially grounded pins. Most prior art spring probes consist of a helical wire spring disposed between a top post (for contacting terminals on the DUT) and a bottom post (for contacting contacts on a circuit board—a device under test board or "DUT board").

Prior art sockets typically have a plurality of contactors disposed in an array of apertures formed through a dielectric holder. By way of example, a high performance, prior art test socket may incorporate a plurality of Pogo® spring contacts, each of which is held in a pin holder with an array of holes through a thin dielectric plate. The dielectric material in a high performance, prior art test socket is typically selected from a group of dimensionally stable polymer materials including: glass reinforced Torlon 5530 available from Quadrant Engineering Plastic Products, Inc. of Reading, Pa.; Vespel; Ultem 2000 available from GE Company GE Plastics of Pittsfield, Mass.; PEEK; liquid crystal polymer; and others. The individual Pogo® spring contacts are typically selected and designed for signal conduction at an impedance level of approximately fifty (50) ohms. In certain high performance, prior art configurations, the contactor is a coaxial type having a center spring pin with a contactor barrel body enclosed within a cylindrical, coaxial, ground shield spaced to achieve a desired signal impedance, typically fifty (50) ohms.

Connectors used in applications for connecting one printed wiring board to another printed wiring board can be classified by type including edge connectors, pin-in-barrel connectors, stamped spring connectors, spring fork connectors, LAN-grid array connectors, conductive elastomeric connectors, and various types known in the art.

Cable connectors adapted to flat cables are generally similar to printed wiring board to printed wiring board connectors with the added feature that one side of the connection is made to a flex cable or a flat array of wires rather than to a printed wiring board. Cable connectors adapted to a round bundle of wires are generally of the type employing a pin in barrel wherein a spring in the barrel retains the pin and applies a lateral force on the pin to establish reliable electrical contact.

The spring incorporated into the barrel element may be a spring insert, a bundle of spring wires or an integral spring in the barrel.

The class of connectors used for socketing ICs is specialized and important the electronics industry. The recent growth in use of BGA terminals for IC packaging has resulted in use of new and varied sockets adapted to BGA terminals for increasing terminal count and area density. BGA sockets have evolved in several directions. One type involves use of a cam driven spring wire to contact the side of each ball. Spring pins or Pogo® pins have been adapted to use in BGA sockets for certain applications in which the high cost of the socket is acceptable.

Low-cost BGA sockets for mass market applications have evolved the use of stamped and formed springs that cradle each ball of the BGA and provide some measure of mechanical compliance needed to urge a spring connector into contact with a mating ball. Variations of stamped and formed springs are configured to use two or more formed springs to grip each ball and thereby make positive electrical contact while retaining the ball mechanically. Miniaturization and density of the mechanically stamped and formed springs are limited by present capabilities to a certain size. Although advances continue to be made in the manufacturing art of stamping and forming springs, sockets with contactors so made are limited in density by the complexity of stamping and forming vary small miniaturized springs. Further, the mechanical compliance of a stamped and formed spring is typically small in a vertical direction perpendicular to a substrate of a ball. Because of small compliance in a vertical direction, a miniature stamped and formed spring may be unable to accommodate motion of a contactor support relative to a ball mated to it, thereby allowing vibration, mechanical shock load and forces, flexure, and the like to cause the connector to slide over the surface of the ball. It is known in the industry that repeated microscopic motion of one contact relative to a mating contact causes fritting or a build up of small, particle debris that can lead to contact failure.

Stamped and formed spring contacts are typically held in an array of shaped holes through in a molded plastic housing to form a connector assembly. As connector assemblies are miniaturized, the molding and assembly process are increasingly difficult and costly, thereby limiting the extension of connectors based on formed spring contacts to very high densities.

BGA sockets have also been constructed with contactors that make electrical contact to a bottom region of a ball by means of bundles of helical wires, wires in elastomer material, cantilever springs, lithographically formed flat springs and other contactors that apply force vertically to a mating ball. The vertical force is necessary to make a good connection between a ball of a BGA and such contactor is significant for BGA packages with a large number of balls or bumps. For example, the clamping force for a BGA socket that applies force vertically to 1200 contact bumps is as high as 30 Kg, as needed to achieve adequate contact to each of the contact bumps. The clamping force needed by BGA sockets that make contact by applying force vertically is an increasing problem as the number of contact bumps increases into the thousands.

As is well known to those of ordinary skill in the art, a primary function of prior art connectors is to provide reliable and repeatable electrical contact to electrical terminals without causing damage to either. Further, a connector must provide a low resistance connection over a product lifetime that involves repeated temperature cycles, mechanical shock, vibration and flexure. As such, contact resistance is one measure of reliability of a connector as determined as a function of a number of temperature cycles, a number of drops, a number of flexures and a G-force level of vibration. As connectors are miniaturized, improvements in reliability are needed to meet the requirements of future electronic systems.

Advances in the density and speed of electronic devices are placing additional demands on connectors. In particular, a continuing increase in the wiring density of electronic systems requires a corresponding advance in the density of connectors as determined by the number of contacts per unit area. Further, at higher frequencies and clock speeds, the size and the self inductance of connectors are becoming an important limitation to system performance. In addition to a lower inductance, advances in impedance control and shielding are required for future electronic systems.

In light of the above, despite the many connector technologies available in the prior art, there is a need in the art for a connector that can satisfy one or more of the above-identified demands relating to smaller size, higher density and higher performance.

The following is a listing of patents believed to be relevant to the present invention.

U.S. Pat. No. 3,676,838, which is believed to be the most relevant patent to the present invention, discloses a clamp-type connector having U-shaped elements in a socket intended to grip ball-like pins of a plug. Despite being of a substantially larger scale than the present invention, the structure of the gripping mechanism, particularly as represented by FIGS. 5 and 6, rely on a pair of detents in opposing expandable grips of the receiving socket. Unlike the present invention, the gripping mechanism does not tend to tighten only upon attempted withdrawal of the pin but relies on the boundaries of the detent to maintain position in the socket. If the detents and balls are of non-matching or of non-uniform size, looseness, non-uniform gripping force and loss of gripping ability may result.

U.S. Pat. No. 5,887,344 is another example of a ball pin fitting into detents of a gripping socket. Folded wings are intended to grip a ball-like tip. The invention therein disclosed features many of the same characteristics of the '838 patent.

U.S. Pat. No. Re. 36,442 illustrates an adapter for emulating a ball grid array type package. Pitch dimensions are equal to or greater than 1 mm and holes may be on the order of 300 microns. There is no evident provision for gripping pins upon attempted withdrawal.

U.S. Pat. No. 5,669,774 illustrates a ball grid array with sockets that have mounted therein petal-like tines to grip balls of the ball array and in that sense is similar to the 838 patent.

U.S. Pat. No. 5,518,410 illustrates a ball to ring contact where the socket contactor element is rotated by a cam upon socketing.

U.S. Pat. No. 6,264,476 illustrates a wire segment based interposer with coaxially shielded socket elements, where the wires, if resilient and in some configurations may have a gripping function, around an insulative core, as for example FIG. 2 and FIG. 3b, but evidently none is disclosed or suggested.

U.S. Pat. No. 6,846,184 discloses various types of contacts composed of springs that impinge but do not grip confronting contact buttons. This type of contact should not be confused with a ball gripping array socket.

Various other ball grid array connectors, banana plugs with split ferrules, interposers, pin arrays and the like are known but are believed to be no more relevant than the illustrative patents.

SUMMARY OF THE INVENTION

According to the invention, a socket connector is provided for making electrical connection in an array to a metal post and more particularly to a conductive metal ball wherein the female element of the connector grips the post with resilient prongs with end tips in such a manner that low insertion force is required but positive contact is maintained and wherein attempted withdrawal is normally inhibited by increasing force applied to the post by the female element in response to the withdrawal force. More particularly, the female element comprises a tube of resilient conductive material that has been sliced or helically partitioned into prongs at a pitch within a selected range of pitches so as to allow the prongs of the connector to spirally open around the post or ball-like bump and mechanically grip the post or bump as the post or bump is inserted along the longitudinal axis of the tube. The prongs of connector tube makes effective electrical contact at several locations around the circumference of the ball. The tubular element according to some embodiments is made by forming resilient helical prongs in the end of a tube in at least two helical cuts (forming opposing prongs) through the tube from about a mid section to one end of the tube.

The female prongs of the connector according to the invention preferably are able to grip a ball around its maximum circumference so as to retain the ball within the tube. By fabricating helical prongs on an end of a metal tube by means of laser cutting techniques, a miniature connector may be made that is able to socket a ball as small a flip chip bump, i.e., on the order of 200 microns diameter. The connector according to embodiments of the invention is able retain a ball held within resilient helical prongs to make good electrical contact notwithstanding vibration and mechanical stress.

Numerous benefits are achieved using the present invention over conventional connectors. For example, an embodiment of the present invention provides a means for contacting a dense array of bumps, such as solder balls, with a connector that is only slightly larger than the ball and therefore bumps can be more densely spaced than in the prior art. For example, a connector made by laser cutting a thin wall stainless steel tube can be made with an outside diameter only 100 microns larger than the diameter of the ball, allowing the spacing between connectors to be very small in order to form a high density array of connectors.

A further advantage of the present invention is provided by a tubular connector with helical prongs on a first end that engage a first ball and helical prongs on a second and opposing end that engage a second ball, whereby the prongs of the first end resiliently pull the first ball toward the second ball. This advantage enables use of an array of such connectors to attach an electronic device to a substrate without need for a mechanical retaining component to apply force urging the device toward the substrate.

Yet another advantage is provided by the present invention embodied in a connector that has a low self inductance. Thin laser-cut grooves through the tube allow less magnetic flux penetration into the interior of the tube than a connector made of a helical wire spring. The self inductance of the connector of the present invention may be further reduced by making the helical prongs short, as they extend a small distance from a solid girth around the tubular connector. These and other aspects of the present invention allow a high performance connector.

Depending upon the embodiment, one or more of these benefits may exist. These and other benefits have been described throughout the present specification and more particularly below.

Various additional objects, features, and advantages of the present invention can be more fully appreciated with reference to the detailed description and accompanying drawings that follow.

BRIEF DESCRIPTION OF THE DRAWINGS

FIGS. 3A to 3C are connectors according to the invention for connection to a corresponding top and bottom post in which FIG. 3A shows the connector in an unmated configuration, FIG. 3B shows the connector mated with the bottom post, and FIG. 3C shows the connector mated with the top and the bottom post.

FIGS. 4A to 4F are posts of several designs adapted to mate with a connector according to the invention.

FIGS. 5A to 5C show a connector assembly and a corresponding ball-type metal post in several stages of engagement.

FIG. 5D shows a cross-sectional view of an embodiment of a connector according to the invention which is modified so as to grip and more positively retain a mating ball.

FIGS. 7A to 7C show an array of connectors according to the invention, wherein FIG. 7A is a side cross-section view of the array alone, FIG. 7B is a side cross-section view with connectors engaged with a mating top array of posts and a mating bottom array of posts, and FIG. 7C is a top plan view of the array.

DETAILED DESCRIPTION OF SPECIFIC EMBODIMENTS OF THE INVENTION

According to the invention, a high performance connector is provided for making reliable electrical connection to miniature and typically closely spaced terminals on an electronic device. More particularly, embodiments of the present invention provide a cylindrical metal tube that is cut in a helical pattern of slots into several prongs that are adapted to contact a terminal post around its circumference and to provide electrical contact thereto.

Figure 1A:
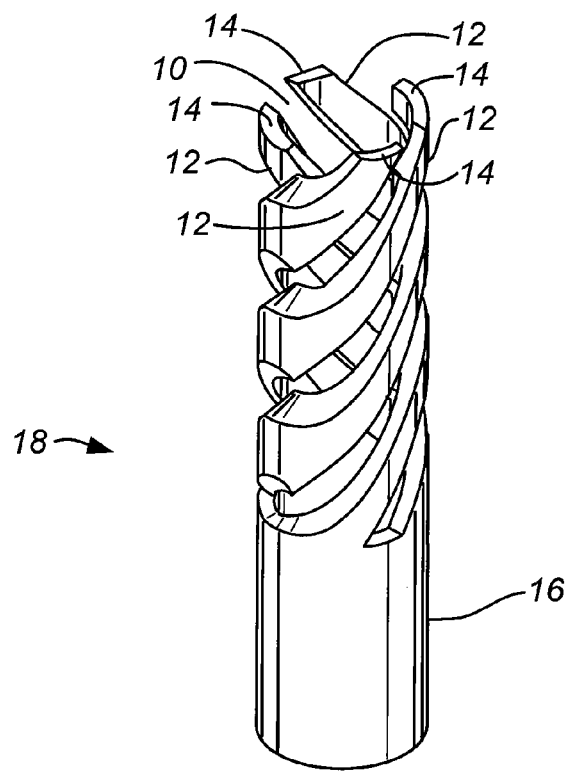
FIGS. 1A and 1B are perspective views of high performance connectors according to the invention with prongs adapted to gripping a terminal post with a ball-like bumps of slightly larger maximum outer diameter than the inner diameter of the connectors.

As illustrated in FIG. 1A, connector 18 comprises a hollow cylindrical metal tube which is cut through by helical slots 10 to form in this instance four canted prongs 12 terminated in four tips 14. Prongs 12 are held in place by cylindrical collar region 16 in the unsliced portion of the tube. The prongs are adapted to grip a post inserted along the axis of connector 18. The posts (not shown) preferably have a ball tip. However, a cylindrical or frustoconical tip having an outer diameter in the mating region that is slightly greater than the inner diameter of the tube is also believed to be within the reasonable spirit and scope of embodiments of the invention. In accordance with one or more preferred embodiments, connector 18 is made from a tube of Type 304 stainless steel having an inner diameter of 440 microns and 550 microns outer diameter. Such stock material is available from K-Tube Corporation of Poway, Calif. Four helical slots 10 are cut by making 20 micron wide cut lines along a 750 mm (as measured along the tube axis) helical path around the tube using for example a Nd—YAG laser. Slots 10 are typically cut at an angle of 35° with respect to a plane perpendicular to the axis of tube 16. Alternatively, slots 10 are measured at an angle of 55° with respect to the axis of tube 16. However, slots 10 cut at between 15° and 75° to the plane are within the contemplation of the invention. Angles less or greater than these do not effectively promote operation of the prongs. After laser cutting, the tube is plated with a 4 micron thick layer of nickel and a 1.5 micron thick layer of soft gold to form a highly conductive surface for contacting a mating post. The steel core provides sufficient resilience to grip while the tube 18 is expanded to accommodate prongs inserted along its longitudinal axis. The connector of FIG. 1A is intended to electrically connect with and physically grip a 500 micron diameter metal ball as a prong or at or near the tip of an inserted prong. The upstream side of the ball, being of a smaller diameter is subjected to less retaining force than the equatorial or maximum outer diameter of the ball. Thus, if the ball is attempted to be withdrawn, the force from the prongs on the ball increases, particularly as the helical prongs are induced to unravel around the tube axis, thereby offering enhanced resistance to withdrawal. In fact, force of withdrawal causes the prongs to stretch and resulting in increased inwardly directed force as the prongs attempt to decrease the inner diameter spacing of the tube. In a specific embodiment, as for example in FIGS. 3A to 3C, the ball 40 is a steel ball plated with a flash coating of nickel and a coating of 2 micron thick soft gold. A force of 10 gf is sufficient to insert the 0.5 mm diameter metal ball into the contactor tube and to provide a contact resistance of about 0.018 ohms. Once engaged, the ball 40 may be held in place by the contactor without need of a clamp or other mechanical holder.

Figure 1B:
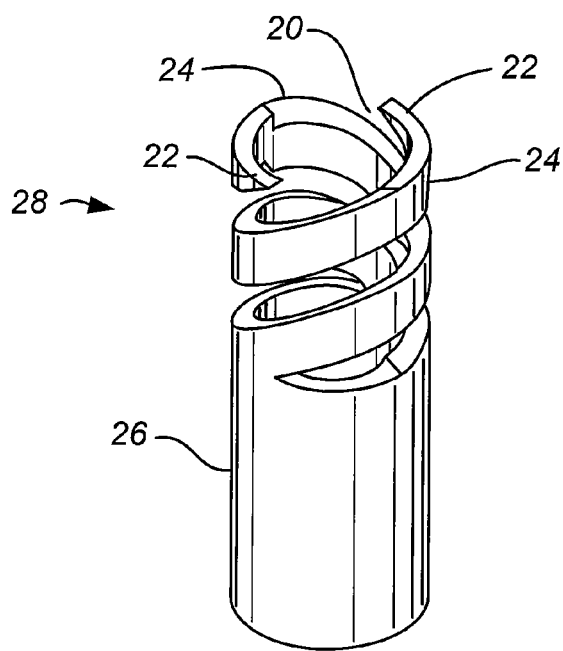

Although the embodiment of FIG. 1A shows four prongs 12, it will be evident to one of skill in the art that the contactor may incorporate any plurality of prongs of two or greater as necessary to grip a post or ball around its circumference with balanced radial forces. This is to be distinguished from the alternative of a tightly-packed coil spring, where the end would correspond to a single prong and thus not be able to offer the gripping leverage of opposing prongs at the end of the tubular structure. For example, contactor 28 in FIG. 1B incorporates two prongs 24 with distal ends ending in tips 22 and with proximal ends attached to the portion of the tube forming a cylindrical collar 26. Prongs 24 are formed by cutting helical grooves through the wall of a cylindrical metal tube. The insertion force for mating a bump with contactor 28 depends upon the angle of the cut line 20, which in this embodiment is preferably at angle between 15° and 75° and more preferably between 20° and 70° as measured with respect to a plane perpendicular to the axis of the tube. Further benefit may be derived from varying the angle of cut line 20 with axial distance along connector 28. For example, the sense of the angle of the helical cut may be alternated from positive to negative in order to further reduce self inductance of the connector; the sense of the line may be varied over an axial distance to produce a serpentine cut line. In addition, cut line 20 may vary in width along the axial length of the cut.

The constituent material of connector 18 is also 304 stainless steel of wall thickness 0.05 mm. The thickness of the tubing material of the connector is selected to supply a required insertion force for insertion of a post into the connector, and is preferably between 2% and 20% of the inner diameter of the tube. The thickness and material of the cylindrical tube may vary depending upon requirements of the application. For example, the material may be selected from a group without limitation including stainless steel of various types, tempered steels, beryllium copper, phosphor bronze, copper alloys of various types, nickel tungsten alloys, nickel chromium alloys, nickel manganese alloys, nickel binary and ternary alloys, titanium alloys, and even nitinol-type alloys. (Nitinol is an acronym for NIckel TItanium Naval Ordnance Laboratory and refers to a family of intermetallic materials which contain a nearly equal mixture of nickel and titanium and other spring materials and which exhibit temperature sensitive spring properties including shape memory and superelasticity.) The connector may be plated with copper, nickel, cobalt, palladium, gold, and alloys thereof, as well as other conductive films. A high strength conductive film coating on the tube, for example and without limitation including Ni—W alloys, Ni—Co alloys, Ni—Cr alloys, Ni—Mn alloys, Ni—V alloys and combinations thereof, may be used to further strengthen the material of the tube. In further embodiments, a connector lubricant may be applied to the surface of the prongs of the connector to reduce fritting and improve lifetime of the connector.

In addition, the high performance connector of the invention may be fabricated by means including but not limited to; laser cutting of tubular material, plasma etching of tubular material, pattern etching of tubular material, pattern plating of tubular material, layer plating of tubular material, LIGA plating, and combinations thereof. The tubing of the connector is typically a cylinder of circular cross section, although oblong, square, or polygonal cross section tubes are also within contemplation of the invention. For example, the tube may be a cylindrical tube of circular cross section that has been flattened on four sides. In a further variation, the connector may be fabricated as part of a substrate carrier structure. Laser annealing, flash annealing, ion beam treatment, pickling, quenching, heat treating and other treatments known in the art may be used to improve properties of the spring material of the connector.

Figure 2C:
FIGS. 2A, 2B and 2C are perspective views of double-ended connectors according to the invention with prongs for gripping a terminal post.
Figure 2B:
Figure 2A:

Further advantages accrue in embodiments of the invention in which a double-ended connector is provided in which each of the two ends are interchangeable or otherwise equivalent. FIGS. 2A, 2B and 2C are embodiments of the present connector in which a bottom end is equivalent to the top end in that the mechanical force needed to mate the top end of the connector to a specified terminal post is substantially the same as the mechanical force needed to mate the bottom end to the specified terminal post. Equivalence of the two ends may be achieved by cutting a pattern through the bottom end of a tube that is a mirror image of the pattern cut through the top end of the tube. The pattern may be mirrored by a plane perpendicular to the axis of the tube as in FIG. 2B. The pattern may be mirrored around a point on the axis of the tube as in FIG. 2A. Additionally, the bottom pattern may be rotated about the axis with respect to the top pattern without substantially changing equivalence of the operation of the top and the bottom pattern.

Double-ended connectors of FIGS. 2A, 2B and 2C offer significant manufacturing advantages in the assembly of such connectors into arrays. Individual connectors may be inserted into an array of holes in a carrier sheet by automated equipment without the need for examining and orienting the connector in either an up or down configuration. In this embodiment, a variety of double-ended connector shapes provide equivalent mating forces to a bump. FIG. 2A is a double-ended connector in which four prongs on both the top end and the bottom end form a right handed helix. FIG. 2B is a double-ended connector in which four prongs on the top end form a right handed helix and the four prongs on the bottom end form a left handed helix. FIG. 2C is a double-ended connector in which four prongs on the top end and the four prongs on the bottom end form an angle with the axis of the connector that varies with distance along the axis to form a zigzag pattern. Although a double-ended connector with equivalent ends provides advantages in simplifying manufacturing assembly, one skilled in the art will appreciate that a double-ended connector of this invention need not have ends that are mechanically equivalent. For example, in certain applications it is desirable that one end of a connector remain firmly attached to a mating post while the opposite end is easily disengaged from its mating bump. High performance connectors for these certain applications will have a top and a bottom end that are not mechanically equivalent.

A double-ended connector of the invention provides a means for electrically and mechanically connecting a corresponding pair of terminal posts thereby providing a high performance electrical connection therebetween. FIG. 3A shows a double-ended connector 34 juxtaposed between top terminal post 40 and bottom terminal post 44. In this embodiment bottom terminal post 44 is a 0.5 mm diameter Sn—$Ag_{3.5}$ solder ball soldered to copper pad 46 on polyimide printed wiring board 33. Correspondingly, top terminal post 40 is a 0.5 mm diameter steel ball plated with thin Ni/Au and thermocompression bonded to gold plated copper pad 38 on a via in a polyimide printed wiring board 30. Connector 34 is a 2.0 mm long 304 stainless steel tube with an inner diameter of 0.44 mm and an outer diameter of 0.55 mm that is cut through along each of a top and a bottom end into four resilient helical prongs 36 and 38 respectively of axial length 0.75 mm. FIG. 3B shows connector 34 after being urged downwardly to engage and mate with bottom terminal post 44. FIG. 3C shows a subsequent step in which top terminal post 40 is mated with connector 34 by urging board 30 downwardly thereby causing top terminal post 40 to engage with prongs 36 of connector 34. Connector 34 in FIG. 3C holds top terminal post 40 and bottom terminal post together mechanically while connecting them electrically. The mating force of approximately 20 grams is reduced considerably by ancillary vibration of substrate 30 during mating of connector 34 to terminal post 44.

As will be appreciated by one skilled in the art, an array of connectors such as 34 may be used to electrically and mechanically connect an electronic device, such as a circuit board 30, to a system such as circuit board 32 without use of clamps or mechanical constraints. Connector 34 may be configured with prongs 36 and 38 such that when mated, post 40 is captured and urged downwards by a clamping action of prongs 36 around post 40. Likewise, with a similar configuration of prongs 38, post 44 is captured and urged upwards by a clamping action of prongs 38 around post 44. By means of specific design of prongs 36 and 38, connector 34 can be made to draw circuit board 30 toward circuit board 32 upon mating of posts 40 and 44 with the connector 34. By way of example, prongs 36 are more preferably designed to make contact around the circumference of the post 40 at several points that lie on or above the maximum circumference of post 40. By this method, a substrate 30 of a first electronic device may be mounted to substrate 32 of a second electronic device without the need for mechanical clamps or constraints. When mated, the connectors 34 draw the first and second electronic devices together and hold them in place both laterally and vertically. The first electronic device may be demounted by urging substrate 30 upward with sufficient force to overcome the retaining force holding terminal post 40 within connector 34.

In certain applications requiring that connector 34 be permanently attached to board 32, connector 34 may be permanently affixed to post 44 on substrate 32 by reflowing solder bump of post 44 thereby wetting and attaching connector 34 to post 44 on printed wiring substrate 32. In certain other applications, the board 30 may be temporarily connected to the board 32 in order to test the assembled system before permanently connecting board 30 to board 32 by heating the assembly. In this application, bumps 40 and 44 are both formed of solder or solder-coated metal balls such that heating causes the solder bumps to flow, thereby soldering pad 46 to prongs 38 of connector 34 and soldering pad 38 to prongs 36 of connector 34. Solder may be prevented from flowing up the prongs 36 and 38 by solder stops, such as oxidized nickel or other solder stops known in the art.

Terminal posts including but not limited to those shown in FIGS. 4A to 4F may be adapted for use with an electrical connector of the invention. Terminal post 50 of FIG. 4A is a solder ball that is soldered to copper pad 54 on printed wiring board 56. Solder bumps are typically spherical sections shaped by surface tension during melting and reflow of the bump. Solder balls may have a core of solid metal such as a nicke-plated copper sphere. Solder bumps may also be shaped mechanically into solder posts and columns, as in a column grid array available from IBM Microelectronics of Burlington, Vt. Solder bumps 50 are typically axially symmetrical.

Terminal post 60 of FIG. 4B is a solid metal ball 62 attached to annular metal ring 64 on printed wiring board 66 by means of thermosonic or thermocompression bonding. Preferably thermosonic bonding is used to attach nickel/gold plated copper ball 62 to gold plated annular copper ring 64. Terminal post 60 is suited for mating with a high performance electrical connector of the invention for high temperature applications for which a solder bump is not well suited. Ball 62 is a spherical ball of metal such as without limitation brass, bronze, stainless steel, carbon steel, copper, silver, nickel and alloys thereof. Metallic ball 62 may have thin metal coatings of nickel, Monel, gold, palladium, silver, rhodium, osmium, and alloys thereof to protect the ball against corrosion. Alternatively, ball 62 may be made of a polymer, glass, hollow polymer, or other dielectric material that is coated with a thin metal film. Ball 62 of terminal bump 60 may be supplied in varying sizes in order to regulate and control the engage/disengage force for mating to an electrical connector of the invention. For example, a ball with a larger diameter is be mated with a bottom end of connector 34, while a ball with a smaller diameter is mated with a top end in order to allow for relatively easy engagement and disengagement of the top ball from connector 34.

Terminal post 70 of FIG. 4C is a metal post 74 with an axially symmetrical head 72 and an elongated end that is held in a plated through hole 78 in printed wiring board 76. Post 74 is commonly available in the industry as a Swiss machined brass pin. Post head 72 has a chamfered or rounded top edge that facilitates mating with a high performance electrical connector of the invention.

Terminal post 80 is a metal boss 82 made by plating metals such as Ni, Cu, Ni—Ag, Sn—Ag, or other materials known in the electrochemical art onto pad 84 on substrate 86. Tip 70 of terminal post 80 may be made of a different metal to facilitate mating with the connector. The circumference of post 82 may be made a function of height to further facilitate mating with connector 34. Alternatively, post 70 may be made by etching a layer of metal such as Cu, Ni, and various alloys to leave a cylindrical boss 82.

Terminal post 90 is a metal ball 92 held above the surface of substrate 96 by collar 94. Such an elevated post 90 may provide augmented mechanical retention properties when mated with connector 34 or other embodiments of this invention. By way of example, terminal 90 may be fabricated by first plating an annular ring 94 on substrate 96. Ball 92 may be selected to be a copper ball with thin surface coatings of nickel and gold. Ball 92 is joined to collar 94 by means of thermosonic bonding or thermocompression bonding as is well known in the art of electronic packaging.

Terminal post 100 provides an advantage of low profile not provided by other terminal posts that project above the surface of a substrate. Post 100 is made by cutting an annular ring 104 in a top surface of circuit board 106. Top 102 of post 100 and side walls 108 and 110 are coated with a thin layer of metal such as copper, typically by electroless seeding and then electroplating copper to a desired thickness. Terminal post 100 provides a recessed surface 110 that mates with connector 34.

FIG. 5B shows mated connector assembly 130 according to one or more embodiments of the invention, while FIG. 5A shows components of assembly 130 before mating. A ball 122 is attached to substrate 126 by collar 124, thereby providing a terminal post for mating with connector 132. Connector 132 comprises a metal tube in which a top end is cut by one or more spiral slots from a mid section of the tube to the end, thereby forming resilient helical prongs 134. Prongs 134 remain attached to a mid section of the tube at a proximal end and are free to flex at a distal end. Connector 132 is attached to substrate 120 at a bottom end held in plated hole 140 by solder 146. A wire 148 is connected through via 142 to connector 132 by solder mass 148. Ball 122 is mated to connector 132 by urging substrate 126 downward, thereby displacing resilient prongs 134 outwardly away from the axis of connector 132. Prongs 134 contact ball 122 around its circumferential girth at a height where the circumference of ball 122 is near a maximum. The prongs 134 urge inwardly upon ball 122 to make positive electrical contact with the ball and to grip the ball and retain it within connector 132. Two or more resilient prongs contact the ball at two or more points around its circumference.

Connector assembly 130 provides electrical contact that is resistant to shock and vibration. Resilient prongs 134 grip ball 122 and flex to allow the ball to move in a lateral and in a vertical direction without loosening its grip on ball 122. Mechanical stress, vibration, mechanical shock, warpage, and thermal cycling cause prongs 134 to flex while they retain a grip on ball 122. By way of example FIG. 5C shows substrate 126 after being moved vertically, thereby exerting stress on connector 132 and causing resilient prongs 134 to flex and extend in a vertical direction. Whilst prongs 134 distend and flex vertically, they retain a grip on ball 122 that allows continuous electrical contact. Further, flexure of prongs 134 significantly reduces rubbing of the ball against connector 132 due to vibration or other mechanical stress on assembly 130. A reduction of rubbing or "fretting" of ball 122 against surfaces of connector 134 improves the reliability and extends the life of connected assembly 130. Fretting as caused by rubbing of one metal surface against another metal surface is well known in the art to produce fine particulate debris at the site of contact, such debris degrading the electrical reliability of an electrical connection between the two metals. Preferably, to reduce fretting, the resilient prongs 134 are formed by two or more slots cut at equal intervals around the circumference of connector 132, where each slot is cut at an angle of between 15° and 75° and more preferably between 20° and 70° with respect to the axis of the connector. Additionally, and more preferably, resilient prongs 134 are formed by slots cut to a length measured along the an imaginary line on the midpoint of the slot that is at least as long as half of the outer circumference of the tube of connector 132.

A further improvement 152 of connector 132 acts to draw ball 122 into the connector in a direction along its axis. FIG. 5D shows connector 152 as improved by modifying the slots 158 between each prong 154 so as to widen the slot 158 with distance away from the top end of connector 152 as measured along the its axis. An increase in the width of each slot 158 with distance from the top end of connector 152, at a region where ball 122 contacts prongs 154, causes prongs 154 to pull ball 122 further into connector 152. The inwardly directed force on ball 122 is due to a flexure of prongs 152 with movement of the ball along the axis of connector 152. The inwardly directed force on ball 122 is due to flexure of prongs 154 caused by a widening of slot 158 with distance away from top end of connector 152. In order to cause an inwardly directed force on ball 122, it is not necessary to emboss prongs of connector 152, to slope the walls of the tube of connector 152, to curl the prongs 154 toward the axis of the tube, or other distortions of the tube. The inner and outer walls of tube of unmated connector 152 are straight and parallel to the axis of the tube. Unmated connector 152 comprises portions of a right regular cylinder, the walls of which are a projection of a loop along the axis of the cylinder. Preferably the loop is a circle and the cylinder is a right circular cylinder. Because connector 152 exerts an inward or compressing force on a mating ball 122 without the need for dimpling, embossing, twisting or otherwise deforming the tubular body of the connector, the connector 152 is easily fabricated by laser cutting a tube with a specific pattern consistent with one or more embodiments of the invention.

Figure 6A:
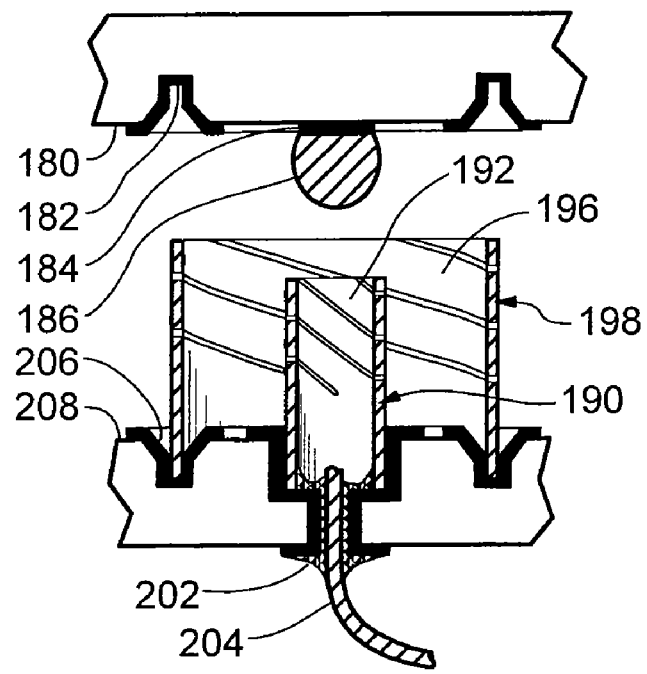
FIGS. 6A and 6B show cross-sectional views of an embodiment of a connector according to the invention with a coaxial ground shield connector and a mating metal terminal post and ground contact, which in FIG. 6A is in an unmated position, and in FIG. 6B is in a mated position
Figure 6B:
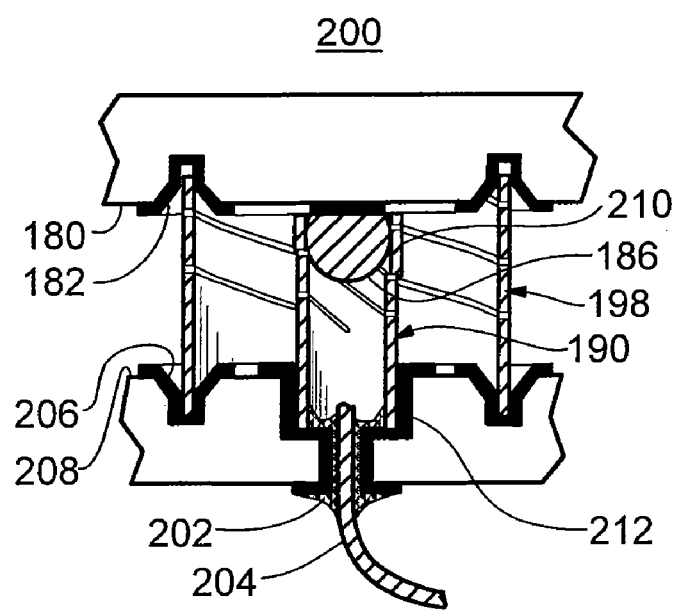

According to one or more embodiments of the invention, tubular connector elements may be configured in a coaxial connector assembly 200 as for example shown in FIG. 6B. Coaxial connector assembly 200 includes terminal post 186 on top substrate 180, terminal annulus 182 on top substrate, an inner connector 190 attached to conductive receptacle 212 on bottom substrate, and an outer connector 198 attached to conductive annular receptacle 206 on bottom substrate 208. In one or more embodiments of the invention, inner connector 190 is electrically connected to a signal wire 204 by solder 202 linking wire 204 to conductive receptacle 212. Wire 204 may be the center conductor of a coaxial cable—not shown in order to facilitate illustration of principles of the invention—for which a coaxial shield is electrically connected to conductive receptacle 206. The coaxial connector assembly 200 provides a high performance signal connection for which a signal carried by inner connector 190 is shielded from ambient electrical interference. Assembly 200 also provides a connection of controlled impedance approximately $Z_o = 60 \ln(D/d)$, where D is the inner diameter of outer connector 198 and d is the outer diameter of inner connector 190.

FIG. 6A shows coaxial connector assembly 200 before mating. Although FIG. 6A shows both outer connector 198 and inner connector 190 affixed to bottom substrate 208, the inner conductor may be affixed to a bottom substrate and outer connector 198 may be affixed to a top substrate. Alternatively, both inner connector 190 and outer connector 198 may be affixed through an interposer sheet such that the top ends of the inner and outer connectors extend above the interposer sheet to mate with contact terminals on a top substrate, and bottom ends of the inner and outer connectors extend below the interposer sheet to mate with contact terminals on a bottom substrate. Mechanical vibration, such as ultrasonic vibration, acoustic vibration, impulse shock, and the like may be used to facilitate mating or de-mating of the connector.

Coaxial connector assembly 200 offers advantages in provides a simple mechanical coaxial connector that may easily be miniaturized. One or more embodiments of the coaxial connector are self locking and do not require clamps, clips, bayonet bases, clamshell holders or other means of holding the mating contacts together. It will be understood that in certain applications an added mechanical restraint or clamp may be desirable for assuring that the mating connectors remain mated under conditions of high mechanical stress. Further advantages accrue due to the mechanical compliance of connectors 190 and 198 that enable maintenance of reliable coaxial electrical contact during shock, vibration, thermal transients, and mechanical stress. It will be understood by one of ordinary skill in the art that connectors 190 and 198 may be double-ended, where a top end and a bottom end are mechanically equivalent, in order to simplify volume production assembly of coaxial connectors, because the tubular connectors may be oriented either up or down before being attached to substrate 208. With these and other advantages, one or more embodiments of the coaxial connector may be used for high performance connections between circuit board, for mounting high frequency microelectronic devices, for making temporary connection to an electrical system for purposes of testing, for connecting one coaxial cable to another, and other applications that will be obvious to one in the industry.

FIG. 7A is a cross sectional view on section line A-A' of an embodiment in which a connector array 320 of double-ended connectors 300 is disposed in holes through a carrier sheet 316. In this embodiment, double-ended connectors 300 have a top end and a bottom end which are equivalent in that the force required to insert a given post into the prongs 328 the top end of connector 300 is substantially equal to the force required to insert the same given post into prongs 338 on the bottom end of connector 300. Four resilient helical prongs 326 are formed by four spiral slots 304 extending from a mid-section 342 of connector 300 to the top end of the connector. Proximal ends of prongs 338 are attached around collar region 342 at the mid-section of connector 300, while distal ends are free to flex. When a post is inserted downward along a longitudinal axis of connector 300, resilient prongs 326 flex outwardly, away from the axis, in order to accommodate the post and to contact the post around its circumference.

Figure 8A:
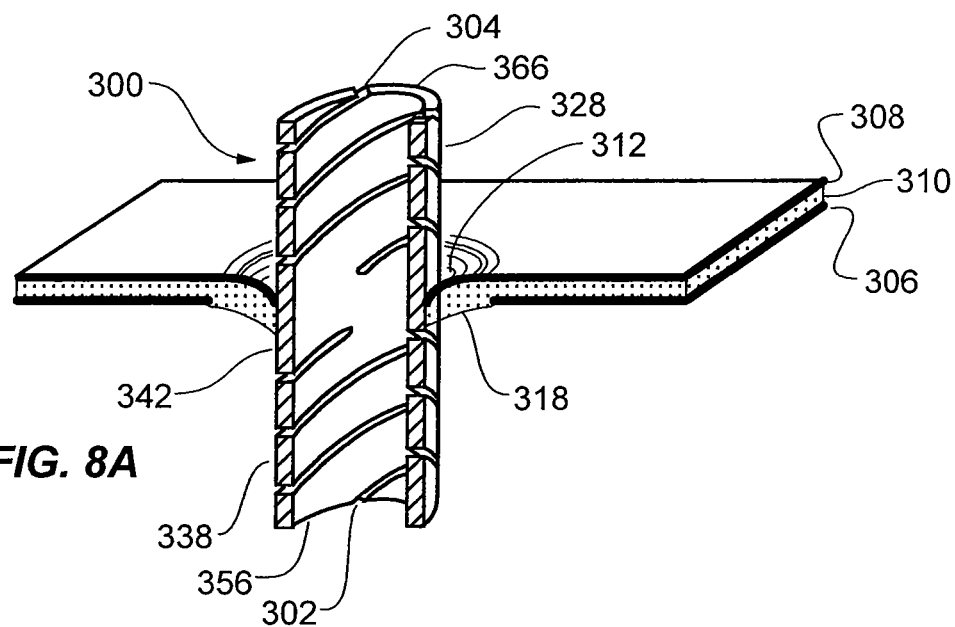
FIG. 8A is a cross-section view in perspective showing a connector according to the invention attached at a collar around its mid section to a carrier sheet.

Each of connectors 300 is held within a hole in carrier sheet 316, whereby a top end of connector 300 extends upward perpendicularly from the carrier sheet and a bottom end extends downward perpendicularly from the carrier sheet. Each of connectors 300 is a stainless steel 304 tube with four spiral slots 302 and 304 extending from a collar 342 around a mid-section to each end of the tube. Slots 302 and 304 are 0.05 mm wide slices made by a Nd—YAG laser through a 0.05 mm thick wall of the tube. In a typical embodiment, slots 302 and 304 are slanted at an angle of 30° with respect to a plane perpendicular to the longitudinal axis of the tube. The tube of connector 300 is 2.0 mm long, with an inner diameter of 0.44 mm and an outer diameter of 0.55 mm. Each connector 300 is attached to a carrier sheet 316 by adhesive 318 joining the carrier sheet 316 to a collar 342 around the mid-section of each connector. Carrier sheet 316 comprises a top metal layer 308 of 0.05 mm thick Be—Cu alloy 172, and a bottom metal layer 306 also of 0.05 mm thick Be—Cu alloy 172, the pair of which sandwich a bondply dielectric film 310 laminated therebetween. Adhesive 318 is a B-staged epoxy that has flowed outward from the bond-ply dielectric material 310 comprising layers of a 0.05 mm thick B-staged epoxy, a 0.05 thick film of polyimide, and a 0.05 mm thick B-staged epoxy. A first group selected from connectors 300 of connector array 320 is connected electrically to top carrier metal layer 308 by metal tabs 312. Details of the attachment of a connector of a first group to carrier sheet 316 are more clearly illustrated in a cross sectional perspective view of FIG. 8A, showing metal tabs 312 held by elastic deformation of the tabs against collar 342 around the mid section of the tube. Metal layer 308 may connect the first group of selected ones of connector 300 to a power distribution circuit or a ground distribution circuit. Additionally, a second group selected from connectors 300 of connector array 320 is electrically connected to bottom metal layer 306 by metal tabs 314. Metal layer 306 may connect the second group of selected connectors 300 in common to a ground distribution circuit, a power distribution circuit, a shielding circuit or other common circuit. The top view of connector array in FIG. 7C illustrates the common connections of a first group of selected connectors to a top metal layer by tabs 312, and other common connections of a second group of selected connectors to a bottom metal layer by tabs 314 (shown dashed).

Carrier sheet 316 holds an array of connectors 300 in predetermined positions. In addition to the construction of an embodiment described above, it will be understood by one of ordinary skill in the art that other configurations of a carrier sheet may be used to hold connectors of the invention. By way of example, carrier sheet 316 may comprise; one or more layers of dielectric material such as polyimide, G-10, Ultem® (available from GE Polymers), glass reinforced epoxy, metal reinforced epoxy, liquid crystal polymer materials, and other polymers; and one or more adhesive materials including but not limited to B-staged epoxy, FEP, PFA, Ultem®, acrylics, PTFE, polyethylene, polyamide, and polyamide blends. The adhesive material may be used in sheet form; in layered form such as bondply laminates; in stencil printable paste such as B-staged epoxy available from CTI, Inc. of Baltimore, Md. in dispensable adhesive materials; and other adhesive materials known in the art. The carrier sheet may be further be formed by embossing, punching, drilling, stretching, and mechanical shaping to fit specific applications.

In further variants, carrier sheet 316 may include one or more metal layers that may provide thermal conductivity, ground plane connections, power plane connections, electromagnetic shielding, control of thermal expansion, mechanical rigidity, intra-connector shielding, impedance control of connectors, pressure seals, integral capacitors between metal layers, radiation shielding, means for mounting for discrete components, substrates for additional wiring layers, over-voltage protection grounding, stress relief springs, and other applications known in the art. Although FIGS. 7A-7C show thin metal layers 306 and 308, the metal layers may be of any thickness, including a first metal layer that extends from a mid-section to the top end of connector 300 and a second metal layer that extends from the mid-section to the bottom end of connector 300. Such thick metal layers are used to provide shielding of one connector from other connectors. By way of example, the diameter of through holes may vary, with a first hole diameter for power and ground connectors and a second hole diameter for signal connectors. A metal layer may be connected to selected ones of the connectors 300 by means known in the art including without limitation, spring actuated contact, soldering, thermo-sonic bonding, laser welding, conductive adhesive joining, press fit mounting, and diffusion bonding. A metal layer may be insulated from other ones of connector 300 by means of an insulating sleeve on the mid-section of the connector, a dielectric coating on the metal layer, an electrodeposited dielectric coating on the metal layer, dielectric adhesive material, an air gap, and other insulative means known in the art. Selected ones of the metal layers may be connected to circuits that provide power, ground, signals, clock timing, chassis ground and other electrical means.

Connectors 300 shown in FIG. 7A-C are double-ended wherein the top end and the bottom end of connector 300 are mechanically equivalent. In certain applications, it is desirable that the top end of the connector requires a low force to engage and disengage a ball post while the bottom end of the connector requires a high force to engage and disengage a similar ball post. For example, it may be desired that a connector remain engaged to a bottom ball post when a top ball post is disengaged from the connector. In this example, the prongs on the bottom of the connector are designed to be stiff and the prongs of the top of the connector are designed to be less stiff. Stiffness of a prong may be lessened by making the slots wider, making the tube wall thinner, changing the number of prongs around the connector, making the prong longer, and making changes in the prong shape as guided by mechanical modeling.

Connector array 320 is used to connect mechanically and electrically a first array of posts 326 on top substrate 322 to a corresponding second array of posts 336 on a bottom substrate 332. The connection is made by juxtaposition of the first array of posts on top substrate 322 over connectors 300 in connector array 320, juxtaposition of the second array of posts 336 on bottom substrate under connectors 300 in connector array 320, and urging top substrate 322 downward toward bottom substrate 332. Thereby posts 326 on top substrate 322 are mated with prongs 328 on top ends of connectors 300 wherein each of prongs 328 contacts a post 326 around its circumference, and posts 336 are mated with prongs 338 on bottom ends of connectors 300. After the connection is made, connector array 320 holds top substrate 322 and bottom substrate 332 together mechanically without the need for a clamp or other restraining means, although such means may be added as an additional protection against damage by mechanical shock.

Connectors 300 hold mating post 326 on top substrate 322 and mating post 332 on bottom substrate 332 together resiliently whereby post 326 may move a small amount in a horizontal direction and a small amount in a vertical direction with respect to post 336 without losing electrical or mechanical connection therebetween. In one or more embodiments, top substrate 322 may be moved with respect to bottom substrate 332 by 0.5 mm in a horizontal direction or by 0.5 mm in a vertical direction without losing contact between posts 326 on top substrate 322 and posts 336 on bottom substrate 332. The relative motion of top substrate 322 with respect to bottom substrate 332 is accommodated by flexure of resilient prongs 328 extending from collar 324 to the top end of connectors 300, and by flexure of resilient prongs 338 extending from collar 324 to the bottom of connectors 300.

After mating, an upward force applied to top substrate 322 acts to stretch prongs 328 of connectors 300 upward without losing connection with posts 326, and to stretch prongs 338 of connectors 300 downward without losing connections to posts 336. Resilience of prongs 328 and 338 enables connectors 300 to maintain electrical and mechanical contact between posts 326 and posts 328 notwithstanding vibration, mechanical shock, thermal mismatch, acceleration forces, gravity, and other stress below a certain threshold. Connectors of one or more embodiments of the invention are able to withstand a force on post mated to a connector of 20 grams before breaking contact therebetween. In order that prongs are sufficiently resilient, the angle of slot 304 between prongs 328 is between 15° and 75° or more preferably between 20° and 70° as measured with respect to a plane perpendicular to the axis of the connector. More preferably, each slot 304 between prongs 328 has a length as measured along its midpoint that is at least one half of the circumference of the tube of connector 300, each as measured on the outer diameter of the tube. In addition, the mechanical properties of retention of a post engaged with connector 300 are enhanced by making the width of slot 304 increase with axial distance from top end 366, and likewise making the width of slot 302 increase with axial distance from bottom end 368. The increase of the width of slot 304 with distance from the end of connector 300 acts to produce an inwardly directed force on a mating ball that is exerted by prongs 328 contacting the circumference of the ball as the ball moves along a region of the axis of connector 300. Preferably the ball is mounted to a substrate in a way such that the maximum circumference lies above the surface of the substrate to which the ball is mounted. Although posts including but not limited to posts 50, 60, 70, and 90 of FIG. 4 are preferred, the connector will operate satisfactorily for a wider range of post geometries.

Figure 10:
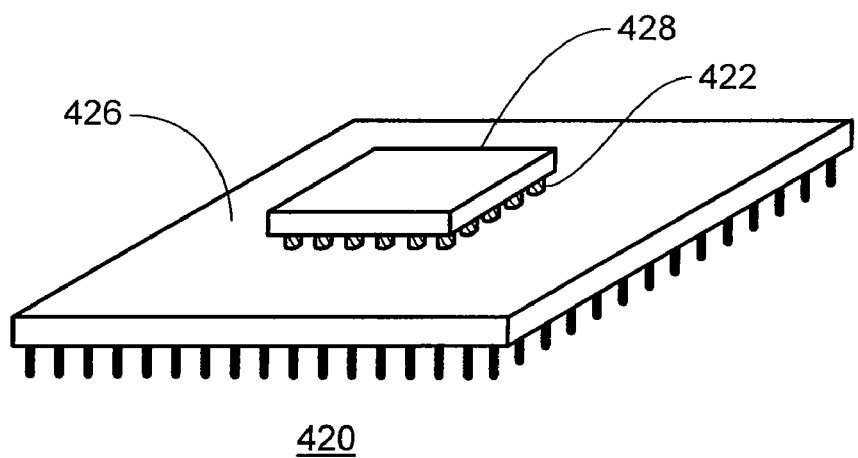
FIG. 10 is a perspective view of an assembly of a micro-electronic device mounted and electrically connected to a system substrate by means of a plurality of connectors according to the invention.

Practical use may be made of the invention in mechanically attaching and electrically connecting one electrical device to another. FIG. 10 shows assembly 420 comprising electronic device 428 mounted to a printed wiring substrate 426 by means of an array of connectors 422. Each of connectors 422 has two or more upwardly oriented prongs that grip a ball (not visible) of the BGA on the bottom surface of device 428. The array of connectors 422 retains device 428 in position without the need for mechanical clamping means to maintain contact during periods of normal mechanical stress. Optionally, a clamp may be added to protect the connections to device 422 against incidents of high mechanical stress. Resilient prongs on connectors 422 flex to protect device 428 against vibration and mechanical shock applied to substrate 426. A further advantage of the invention accrues due to the mating properties of connector 422, wherein the force needed to disengage an array of mated connectors 422 from a BGA is greater than the force need to engage the array of connectors to the BGA. Thereby connectors 422 made according to one or more embodiments of the invention are able to retain electronic device 428 against disengagement forces that are greater than the force initially used to engage the device. This further advantage enables easy mounting of devices on a substrate with a small force, whilst retaining the device against the effects of larger forces of shock and vibration. Disengagement of device 428 is facilitated by use of vibration, ultrasonic energy, or the like to reduce the force needed for disengagement of device 428 from substrate 426.

Connectors 422 according to one or more embodiments of the invention are suited for use in connector arrays for attaching a BGA device to a substrate. By way of example, without limitation, connector 422 may be connector 300 of FIG. 8A, connector 370 of FIG. 8B, and connector 152 of FIG. 5D.

Figure 8B:
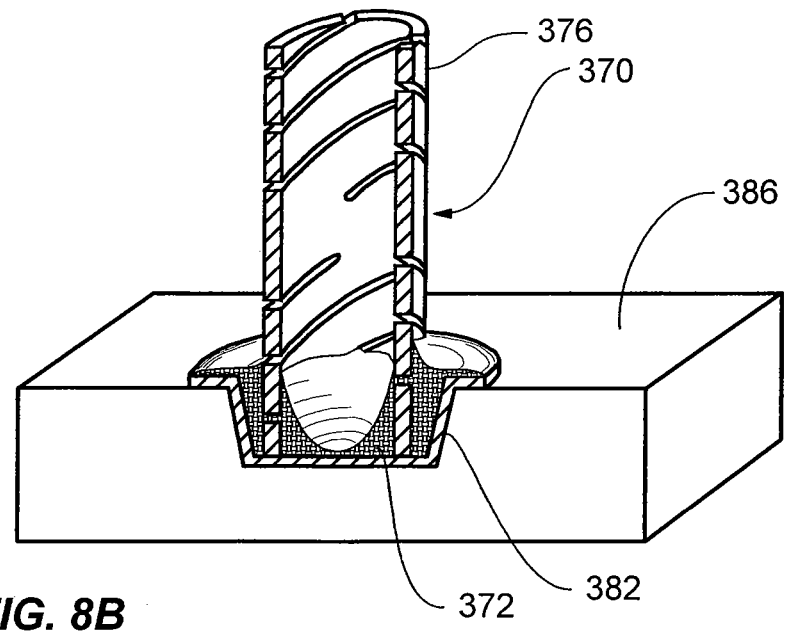
FIG. 8B is a cross-section view in perspective showing a connector attached by solder to a via in a circuit board.

Connector 300 is a double-ended connector attached to a carrier sheet, as described above. Connector 370 is a double-ended connector attached at a bottom end by solder connection 372 to via 382 in substrate 386. Connector 370 of FIG. 8B provides advantages in assembly in that either end of connector 370 may be soldered to via 382 without the need to orient the connector up or down because each end of connector 370 is equivalent to the opposite end. FIG. 5D shows connector 152 with slots 158 that increase in width with axial distance away from the top end of the connector. This increase in width acts to produce a downward force on a mating ball such that the ball is pulled downwardly over a range of vertical position for which the width of slot 158 increased with distance from the top end of connector 152.

Figure 9:
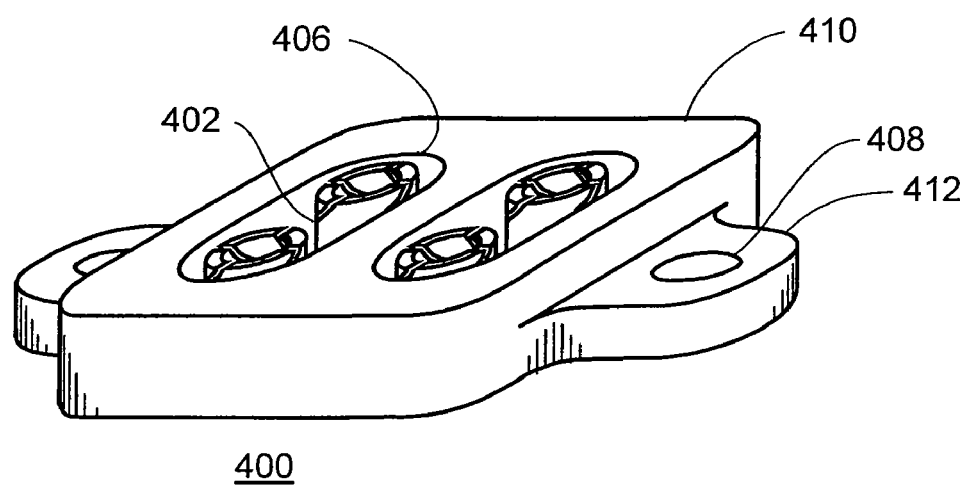
FIG. 9 is a perspective view of an array of connectors according to the invention mounted in an enclosure to form a terminal block.

By way of example, FIG. 9 illustrates another application of one or more embodiments of the invention in which connectors 402 are arrayed in terminal block 400. A pair of connectors 402 is held in a cavity 406 in housing 410. Housing 410 may have a metallic surface so as to shield electrically connectors 402 against electrical noise in the environment. Connectors 402 are adapted to mate with a corresponding set of posts in a mating terminal block (not shown). Although each connector 402 retains a posts mated thereto without need of a clamping force, terminal block 400 is provided with mounting lug 412 and mounting screw hole 408 to provide additional mechanical stability when screws from a mating terminal block are attached through holes 408. It will be understood by one of ordinary skill in the art that any number of contactors may be disposed in each cavity. The connectors 402 may be single ended or double-ended in accordance with one or more embodiments of the invention. Other connector configurations, shielding methods, mounting methods, clamps, and brackets will be obvious to the practitioner in the field.

The invention has been explained with reference to specific embodiments. Other embodiments will be apparent to those of ordinary skill in the art. One of ordinary skill in the art would recognize many variations, modifications, and alternatives. It is therefore not intended that this invention be limited, except as indicated by the appended claims.

What is claimed is:

1. A multiple-contact electrical connector for making electrical contact with a micro-scale electrically conductive male mating element for electronic device connections, said connector comprising:
   a tubular element having an inner diameter less than a maximum outer diameter of a mating element; and
   a printed circuit board having a mating element;
   at least two slots helically cut in said tubular element, said slots forming at least two electrically conductive helical prongs terminating at a first end of said tubular element and extending from a common cylindrical collar region, said helical prongs being operative to impose mechanical resistance around said mating element upon attempted removal of said mating element from said tubular element, wherein the mating element comprises a metal ball and wherein the tubular element has an inner diameter less than the maximum outer diameter of said metal ball whereby both side edges of said helical prongs engage said metal ball at its maximum diameter, said prongs providing sufficient resilience to grip said ball while said tubular element is expanded to accommodate said prongs inserted along the longitudinal axis of said tubular element, wherein the upstream side of the ball, being of a smaller diameter, is subjected to less retaining force than the maximum outer diameter of said ball so that, if the ball is attempted to be withdrawn, the force from the prongs on the ball increases, as the prongs are induced to unravel around the axis of the tubular element, thereby offering enhanced resistance to withdrawal.

2. The connector according to claim 1 wherein the prongs have a longitudinal dimension on the order of less than the radius of said ball.

3. The connector according to claim 1 wherein the tubular element is sliced at an angle between 15° and 75° to a plane normal to the longitudinal axis of the tubular element.

4. The connector according to claim 1 wherein the tubular element has been sliced by a laser to form said plurality of prongs.

5. The connector according to claim 1 wherein said tubular element is a hollow cylinder having a circular cross section and wherein angle of said slices varies with position along said cylinder.

6. The connector according to claim 1 having a second end opposing said first end and wherein said second end and said first end are interchangeable.

7. An electrical connector device including elements forming a mated contact, the mated contact comprising:
   a. a cylindrical tube with a wall of electrically conductive material;
   b. said tube having a top end and a bottom end; and
   c. a metal bump of electrically conductive material in ball shape proximal to said top end and attached to a metal contact, said bump having a diameter greater than the inner diameter of said cylindrical tube;
   d. said top end of said cylindrical tube being divided into at least two prongs by helical cuts through said wall;
   e. said helical cuts arrayed at an angle with respect to a plane perpendicular to the axis of said cylinder;
   f. whereby each said prong engages both sides of said bump at two edges of said prong thereby making electrical contact at several points on said bump, said helical prongs being operative to impose sufficient mechanical resistance around said bump while said cylindrical tube element is expanded to accommodate said prongs and to grip said bump at or beyond the maximum outer diameter of the bump at the same time the upstream side of the bump, being of a smaller diameter, is subjected to less retaining force than at the maximum outer diameter of the bump, such that, force from the prongs on the bump increases upon action to withdraw the metal ball.

8. A connector device as in claim 7 wherein said bump is a solder ball.

9. A connector device as in claim 7 wherein said bump is a solder ball placed on a metal post.

10. A connector device as in claim 7 wherein said cylindrical tube has a circular cross section.

11. A connector device as in claim 10 wherein said angle of said helical cuts is between 15° and 75° with respect to a plane normal to a longitudinal axis of said connector device.

12. A connector device as in claim 11 wherein said angle of said helical cuts varies with position along the cylinder.

13. A connector device as in claim 7 wherein said bottom end is divided into two or more prongs by helical cuts through said wall.

14. A connector device as in claim 13 wherein said top end and said bottom end are interchangeable.

* * * * *